United States Patent [19]

Kodama

[11] 3,990,023
[45] Nov. 2, 1976

[54] ELASTIC SURFACE WAVE DEVICE

[75] Inventor: Toshikazu Kodama, Yokohama, Japan

[73] Assignee: Tokyo Shibaura Electric Co., Ltd., Kawasaki, Japan

[22] Filed: Oct. 14, 1975

[21] Appl. No.: 622,446

[30] Foreign Application Priority Data

Oct. 15, 1974  Japan.............................. 49-117718

[52] U.S. Cl. ............................... 333/30 R; 310/9.8; 333/72
[51] Int. Cl.² ...................... H03H 9/26; H03H 9/30; H03H 9/04; H03H 9/32
[58] Field of Search.............. 333/72, 30 R; 310/8.1, 310/8.2, 8.3, 9.5, 9.7, 9.8

[56] References Cited

UNITED STATES PATENTS

| | | |
|---|---|---|
| 3,839,687 | 10/1974 | Subramanian ......................... 333/72 |
| 3,882,433 | 5/1975 | Subramanian ......................... 333/72 |

OTHER PUBLICATIONS

Toda et al.—"Surface Wave Delay Lines with Interdigital Transducers on PZT Ceramic Plates" in Japanese Journal of Applied Physics, vol. 10 No. 6, June 1971; pp. 671–677.

*Primary Examiner*—Alfred E. Smith
*Assistant Examiner*—Marvin Nussbaum
*Attorney, Agent, or Firm*—Oblon, Fisher, Spivak, McClelland & Maier

[57] ABSTRACT

An elastic surface wave device comprises a piezoelectric substrate and at least one pair of first and second interdigital electrodes provided on the surface of the piezoelectric substrate, in which when a width of one digit section in the first interdigital electrode is represented by $l1$ and a width of one digit section in the second interdigital electrode adjacent the one digit section in the first interdigital electrode is by $l2$ and when a clearance between the adjacent digit sections of the interdigital electrode pair is represented by $l3$ and the central frequency of the fundamental of a surface wave is by $f0$, the following relation is established:

$$l1/vm + l3/vf = 1/4f0$$
$$l3/vf + l2/vm = 3/4f0$$

where
  $vm$: surface wave velocity on the digit section of the interdigital electrode; and
  $vf$: surface wave velocity between the adjacent digit sections of the interdigital electrode pair.

5 Claims, 6 Drawing Figures

ELASTIC SURFACE WAVE DEVICE

This invention relates to an elastic surface wave device having interdigital electrodes.

Generally, an elastic surface wave device uses as an electrical-mechanical energy conversion electrode a pair of interdigital electrodes having digit sections associated in an electrically insulating, interdigitate relation with each other. Since in such an interdigital electrode pair a difference is produced between an acoustic impedance in one digit section of one of the paired interdigital electrodes and an acoustic impedance in a clearance defined between the digit section of one of the paired interdigital electrodes and the adjacent digit section of the other of the paired interdigital electrodes, an elastic surface wave propagating on the surface of a piezoelectric substrate is reflected on the digit section of the interdigital electrode on the surface of the piezoelectric substrate. The reflected elastic surface wave appears as a spurious component in the output signal of the elastic surface wave device.

In order to cancel the reflection of the surface wave due to such a difference between an acoustic impedance in the digit section of one interdigital electrode in the interdigital electrode pair and an acoustic impedance in the clearance defined between the adjacent digit sections of the interdigital electrode pair, the digit section of the interdigital electrode is splitted as disclosed in U.S. Pat. No. 3,727,155, or a floating electrode is provided in the interdigital electrode separately from the digit section of the interdigital electrode as disclosed in U.S. Pat. No. 3,748,603. In these methods, however, a load impedance must be relatively low because of a lowering of impedance of an electrical-mechanical energy conversion transducer using such interdigital electrodes in order to reduce the surface wave reflection due to electro-acoustic regeneration. Furthermore, the device yield of conventional electrode configuration is not so good because of its narrow width of electrodes.

It is accordingly the object of this invention to provide an elastic surface wave device adapted to suppress spurious components.

According to this invention there is provided an elastic surface wave device comprising a piezoelectric substrate and at least one pair of first and second interdigital electrodes, in which when a width of one digit section in the first interdigital electrode is represented by $l1$, and a width of one digit section in the second interdigital electrode adjacent the one digit section in the first interdigital electrode is by $l2$, and when a clearance between both the adjacent digit sections of the interdigital electrode pair is represented by $l3$ and the central frequency of the fundamental of a surface wave is by $f0$, the following relation is established:

$$\frac{l1}{vm} + \frac{l3}{vf} = \frac{1}{4f0}$$

$$\frac{l3}{vf} + \frac{l2}{vm} = \frac{3}{4f0}$$

where
$vm$: surface wave velocity on the digit section of the interdigital electrode; and
$vf$: surface wave velocity between the adjacent digit sections of the interdigital electrode pair.

This invention can be more fully understood from the following detailed description when taken in conjunction with the accompanying drawings, in which.

Figure 1:
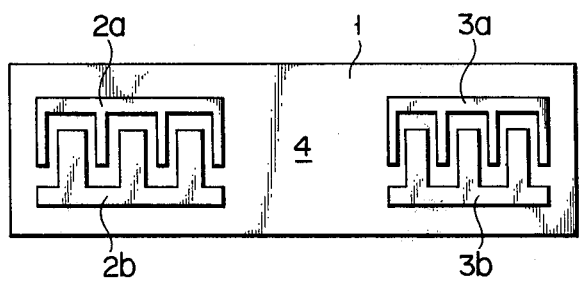
FIG. 1 is a plan view showing one embodiment of this invention.

In FIG. 1 two pairs of interdigital electrodes $2a$, $2b$ and $3a$, $3b$ are provided one pair at each end of one surface of a piezoelectric substrate 1 made of, for example, $LiNbO_3$, thus offering an elastic surface wave device 4. When an input signal is applied between the paired interdigital electrodes $2a$ and $2b$ in the elastic surface wave device 4, an elastic surface wave is generated according to the input signal on the interdigital electrode bearing surface and propagated toward the paired interdigital electrodes $3a$ and $3b$, between which an output signal is generated according to the incoming elastic surface wave. With this embodiment the paired interdigital electrodes $2a$, $2b$ at the input side of the device are formed, for example, as shown in FIG. 2 and, for this reason, little spurious component is included in the output signal.

Figure 2:
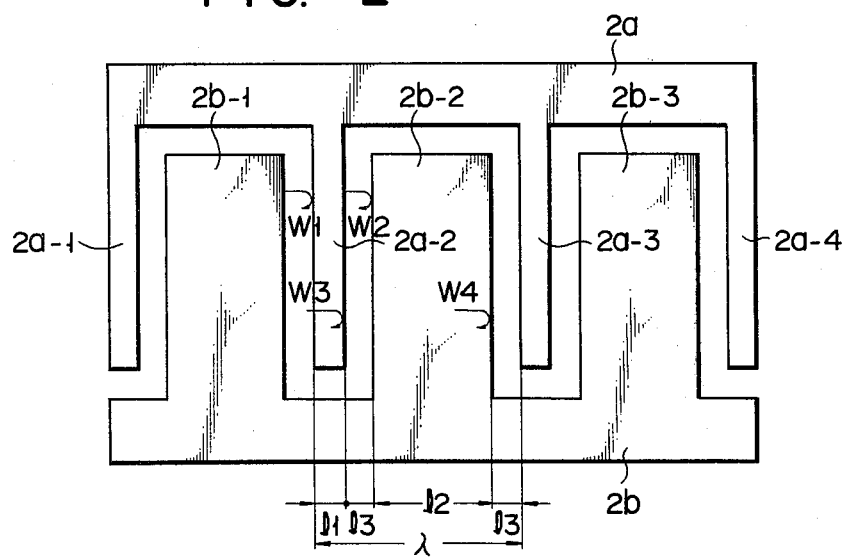
FIG. 2 is a plan view showing in an enlarged form a pair of interdigital electrodes in FIG. 1.

FIG. 2 shows a pair of interdigital electrodes $2a$, $2b$. The interdigital electrode $2a$ includes four digit sections $2a$-1 to $2a$-4 with a predetermined thickness and a width $l1$ as measured in a direction of propagation, while the interdigital electrode $2b$ includes three digit sections $2b$-1 to $2b$-3 having the same thickness as that of the digit sections $2a$-1 to $2a$-4 and a width $l2(l1<l2)$ as measured in the propagation direction. As a consequence, a clearance $l3$ as measured in the propagation direction is left between the digit section in the interdigital electrode $2a$ and the next adjacent digit section in the interdigital electrode $2b$. The following relations will be established between the distances $l1$, $l2$ and $l3$ and a central frequency $f0$ of the fundamental of the elastic surface wave:

$$\frac{l1}{vm} + \frac{l3}{vf} = \frac{1}{4f0} \quad (1)$$

$$\frac{l3}{vf} + \frac{l2}{vm} = \frac{3}{4f0} \quad (2)$$

where
$vm$: velocity of the surface wave in the digit section of the interdigital electrode; and
$vf$: velocity of the surface wave between the adjacent digit sections of the interdigital electrodes.

A variety of values can be taken for $l1$, $l2$ and $l3$ so that the relations (1) and (2) may be satisfied. Values for $l1$, $l2$ and $l3$ can be graphically found using equations in which a relation between $l3$ and $l1$ and $l2$ is defined. For simplicity sake, for example, suppose $vm = vf = v$. In this case, it follows from the equations (1) and (2) that $$l3 = -l1 + \frac{\lambda}{4} \qquad (3)$$

$$l3 = -l2 + \frac{3}{4}\lambda \qquad (4)$$

where $\lambda$ denotes $v/f0$.

Figure 3:
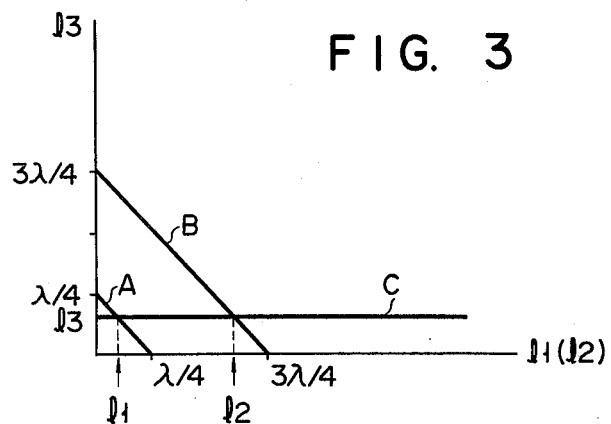
FIG. 3 is a graph for explaining a method for finding the width of adjacent digit sections of a pair of interdigital electrodes in an elastic surface wave device according to this invention.

The equations (3) and (4) were proved satisfactory from the practical viewpoint. Plotting the equations (3) and (4) on a $l3$-$l1(l2)$ coordinate plane of a graph in FIG. 3 gives straight lines A and B. With $l3=\lambda/8$, for example, values for $l1$ and $l2$ can be found by drawing a straight line corresponding to $l3=\lambda/8$ and reading the intersection of the straight line C and straight lines A, B on the $l3$-$l1(l2)$ coordinate plane of the graph in FIG. 2. In this case, $l1=\lambda/8$ and $l2=5/8\lambda$. FIG. 2 shows an arrangement of the interdigital electrodes 2a and 2b where $l1=l3=\lambda/8$ and $l2=5/8\lambda$.

In the interdigital electrode arrangement shown in FIG. 2, a phase difference $\lambda/2$ is obtained, for example, between a reflection wave W1 from the front edge of the digit section 2a-2 in electrode interdigital electrode 2a and a reflection wave W2 from the front edge of the adjacent digit section 2b-2 in the interdigital electrode 2b. In this case, the reflection waves W1 and W2, combined together, become zero. On the other hand, a phase difference $3/2\lambda$ is gained between a reflection wave W3 from the rear edge of the digit section 2a-2 in the interdigital electrode 2a and a reflection wave W4 from the rear edge of the digit section 2b-2 in the interdigital electrode 2b. In this case, the reflection waves W3 and W4, combined together, become zero.

In this way, the reflection waves from the corresponding edges of the adjacent digit sections of the interdigital electrodes 2a and 2b, when combined together, become zero and, in consequence, the reflection wave of the interdigital electrode arrangement as a whole becomes substantially zero with the consequent elimination of spurious components. The same thing holds true for an arrangement of the interdigital electrodes 3a and 3b. The interdigital electrode 2b is made fairly larger in its digit section width than the interdigital electrode 2a. For this reason, there is less chance that breakage will occur in the digit sections of the interdigital electrodes during the manufacture, thus offering a marked improvement in yield. Furthermore, the impedance of the interdigital electrodes 2a and 2b is made greater than that of floating electrodes and of interdigital electrodes with split digit sections and, consequently larger load or source impedance can be used without acoustic wave reflection due to the electro-acoustical regeneration, with the result that spurious components can be reduced.

Figure 4:
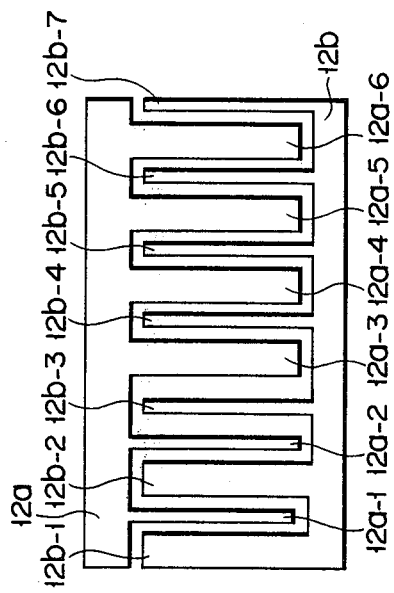
FIG. 4 is a plan view showing another form of a pair of interdigital electrodes in the elastic surface wave device according to another embodiment of this invention.

Although in the arrangement shown in FIG. 2 the digit sections 2a-1 to 2a-4 of the interdigital electrode 2a have the same width and the digit sections 2b-1 to 2b-3 the same width, the interdigital electrodes 12a and 12b may be selectively varied in their digit section width as shown in FIG. 4. In the arrangement of FIG. 4 the interdigital electrode 12a includes digit sections 12a-1 and 12a-2 with a width of $l1$ and digit sections 12a-3 to 12a-6 with a width of $l2$, whereas the interdigital electrode 12b includes digit sections 12b-1 and 12b-2 with a width of $l2$ and digit sections 12b-4 to 12b-7 with a width of $l1$. Likewise, the arrangement of FIG. 4 also permits spurious components to be eliminated as in the case of the embodiment shown in FIG. 2.

Figure 5:
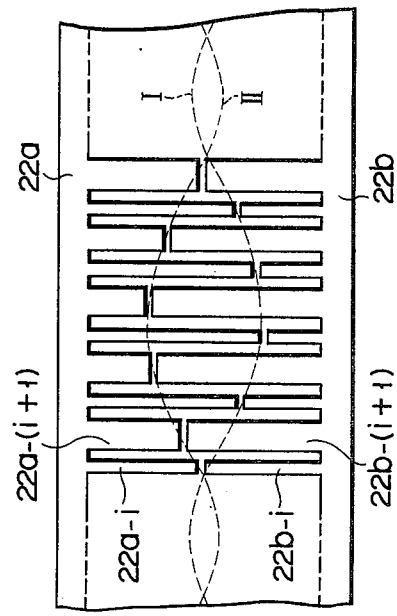
FIG. 5 is a plan view for showing another form of a pair of interdigital electrodes in the elastic surface wave device according to still another embodiment of this invention.

FIG. 5 shows a case where this invention is embodied as an unsymmetrical filter, for example, a surface wave filter for a picture intermediate frequency circuit in a color television receiver. As a pair of interdigital electrodes at the input side of an elastic surface wave device use is made of interdigital electrodes 22a and 22b of the type shown in FIG. 5. The interdigital electrodes 22a and 22b are provided, together with a pair of interdigital electrodes at the output side of the device, on a piezoelectric $LiNbO_3$ substrate of, for example, 8 mm × 8 mm × 0.5 mm having, for example, a Y-cut Z-propagating plane. The interdigital electrodes at the input side of the device, each, include a variety of lengths of digit sections so weighted that a peak is located at the middle of the digit section array, as shown in FIG. 5, with the weighted values gradually decreasing toward each end of the digit section array. Each pitch of the digit section (local wave length) can be determined by expanding a function representing the frequency characteristic of the filter into the Fourier series. Accordingly, in the filter, it is obvious that the width of the digit section is not uniformly formed in the transducer. The weight can be imparted to each digit section of the respective interdigital electrode by varying the pitch of the digit section according to curves I and II in FIG. 5. The interdigital electrode 22a includes an alternate array of first and second groups of digit sections; the digit sections in the first group including one referenced 22a-i and having a width $l1$, and the digit sections the second group including one referenced 22a-(i+1) and having a width $l2$. Likewise, the interdigital electrode 22b includes an alternate array of first and second groups of digit sections starting with the digit section 22b-i in the first group with a width $l1$ which is followed by the digit section 22b-(i+1) in the second group having a width of $l2$. In this embodiment, 90 pairs of digit sections (22a-i, 22b-i) ... are provided in the interdigital electrode pair (22a, 22b). In the case of the interdigital electrode pair at the output side of the device, a weight is likewise imparted to its digit sections as in the interdigital electrode pair 22a, 22b at the input side of the device. The interdigital electrode pair at the output side of the device comprises eight pairs of digit sections, not shown. In this embodiment, a length from the end of the input side interdigital electrode pair 22a, 22b to the output side interdigital electrode pair is, for example, of the order of 7 mm and a maximum overlap width of 6 mm is defined between the adjacent digit sections in the interdigital electrode pairs. For example, a pair of input side interdigital electrodes are $Al$-evaporated, together with a pair of output side interdigital electrodes, on the surface of the piezoelectric substrate.

Figure 6:
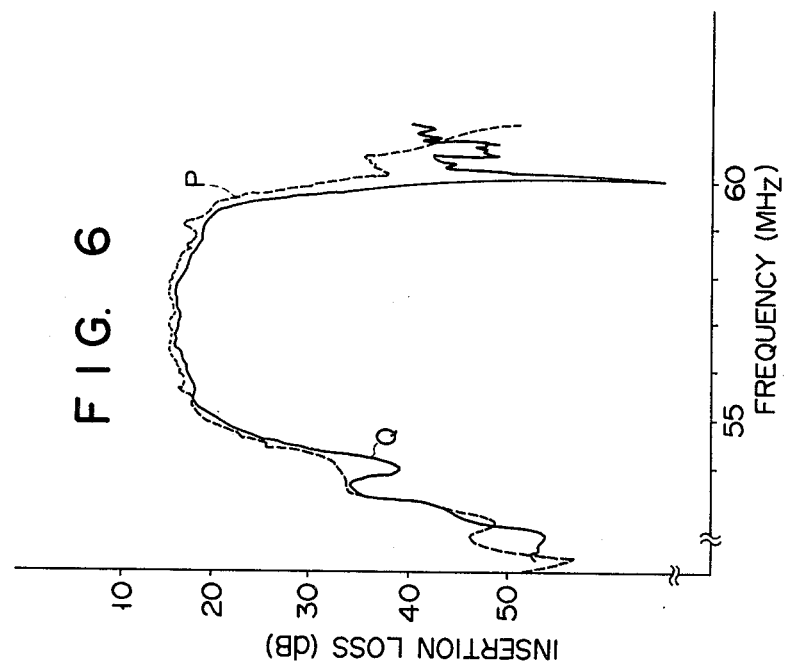
FIG. 6 is a plot of an insertion loss against a frequency when this invention is used as a surface wave filter for a picture intermediate frequency circuit in a color television receiver.

FIG. 6 shows a plot of an insertion loss against an input frequency [MHz] of the above-mentioned surface wave filter in the picture intermediate frequency circuit of the color television receiver, where a solid line Q denotes a characteristic in the surface wave device according to this invention and a dotted line P, a characteristic in a conventional surface wave device.

Upon comparison of the two it will be evident that a spurious component at 55 to 60 MHz is prominently decreased (i.e. ripple is reduced by 0.5 dB) in the case of the surface wave device according to this invention (see the solid line Q). The decrease of the ripples by the magnitude of 0.5 dB means that the delay time of the surface wave device involves a deviation of the order of about 50 nsec. FIG. 6 shows the characteristic curve with a central frequency of 57.2 MHz and a 3 dB band width of 4 MHz.

As will be evident from the foregoing it is possible according to this invention to effectively eliminate such spurious components resulting from reflection surface waves in the digit sections of the interdigital electrode pair, as well as reflection due to the electro-acoustic regeneration. Since this invention is effective for the fundamental of the surface wave, it will be self-evident that it can prove effective for odd-order high harmonics including third-and fifth order harmonics.

What is claimed is:

1. An elastic surface wave device comprising a piezoelectric substrate and at least one pair of first and second adjacent interdigital electrodes provided on the surface of the piezoelectric substrate, in which when a width of one digit section in said first interdigital electrode is represented by $l1$ and a width of one digit section in said second interdigital electrode adjacent the one digit section in said first interdigital electrode is by $l2$ and when a clearance between both the digit sections of said interdigital electrode pair is represented by $l3$ and the central frequency of the fundamental of a surface wave is by $f0$, the following relation is established:

$$\frac{l1}{vm} + \frac{l3}{vf} = \frac{1}{4f0}$$

$$\frac{l3}{vf} + \frac{l2}{vm} = \frac{3}{4f0}$$

where
- $vm$: surface wave velocity on the digit section of the interdigital electrode; and
- $vf$: surface wave velocity between the adjacent digit sections of the interdigital electrode pair.

2. An elastic surface wave device according to claim 1, in which said first interdigital electrode has a plurality of digit sections each with a width $l1$ and said second interdigital electrode has a plurality of digit sections each with a width $l2$.

3. An elastic surface wave device according to claim 1, in which said first interdigital electrode has a first group of digit sections each with a width $l1$ and a second group of digit sections each with a width $l2$, and said second interdigital electrode has a third group of digit sections each with a width $l2$ associated in an electrically insulating interdigitate relation with said first group of digit sections and a fourth group of digit sections each with a width $l1$ associated in an electrically insulating interdigitate relation with said second group of digit sections.

4. An elastic surface wave device according to claim 1, in which said first interdigital electrode has an alternate array of first digit sections with a width $l1$ and second digit sections with a width $l2$, and said second interdigital electrode has an alternate array of third digit sections with a width $l1$ and fourth digit sections with a width $l2$, said first and second digit sections in said first interdigital electrode confronting said third and fourth digit sections of said second interdigital electrode, respectively.

5. An elastic surface wave device according to claim 4, in which the length of the digit sections of said first and second interdigital electrodes is so weighed as to obtain a predetermined relation.

* * * * *